US012641725B2

(12) United States Patent
Bitz et al.

(10) Patent No.: US 12,641,725 B2
(45) Date of Patent: May 26, 2026

(54) METHODS AND ELECTRONIC SYSTEM ASSEMBLIES FOR A PRINTED CIRCUIT BOARD OVER PRINTED CIRCUIT BOARD ASSEMBLY

(71) Applicant: Micron Technology, Inc., Boise, ID (US)

(72) Inventors: Bradley Russell Bitz, Meridian, ID (US); David R. Christianson, Meridian, ID (US); Travis Michael Jensen, Boise, ID (US); Kimball Davis Lowry, Boise, ID (US); Joao Elmiro Chaves, Middleton, ID (US)

(73) Assignee: Micron Technology, Inc., Boise, ID (US)

( * ) Notice: Subject to any disclaimer, the term of this patent is extended or adjusted under 35 U.S.C. 154(b) by 229 days.

(21) Appl. No.: 18/530,869

(22) Filed: Dec. 6, 2023

(65) Prior Publication Data

US 2024/0206069 A1     Jun. 20, 2024

Related U.S. Application Data

(60) Provisional application No. 63/387,422, filed on Dec. 14, 2022.

(51) Int. Cl.
*H05K 1/14*          (2006.01)
*H05K 1/02*          (2006.01)

(52) U.S. Cl.
CPC ........... *H05K 1/144* (2013.01); *H05K 1/0203* (2013.01); *H05K 2201/10015* (2013.01); *H05K 2201/10734* (2013.01); *H05K 2201/10984* (2013.01)

(58) Field of Classification Search
CPC ................... H05K 1/0203; H05K 1/14; H05K 1/141–147; H05K 1/18;
(Continued)

(56) References Cited

U.S. PATENT DOCUMENTS

| 7,863,100 B2 * | 1/2011 | Yang | ................... | H01L 23/3128 |
| | | | | 438/109 |
| 8,767,409 B2 * | 7/2014 | Cheng | ................... | H05K 1/144 |
| | | | | 361/784 |

(Continued)

*Primary Examiner* — Tuan T Dinh
(74) *Attorney, Agent, or Firm* — Harrity & Harrity, LLP

(57) ABSTRACT

A method and an electronic system assembly that includes a first circuit substrate having a surface, wherein the surface has a two-dimensional area defined in a first dimension and a second dimension; a plurality of first semiconductor chip packages mounted on and electrically coupled to the surface; a plurality of second circuit substrates positioned over the surface, wherein each first semiconductor chip package is arranged between the surface and a respective second circuit substrate in a third dimension; a plurality of conductive interconnect structures that extend in the third dimension, wherein the plurality of conductive interconnect structures are provided in a plurality of interconnect groups, and wherein each interconnect group connects a different second circuit substrate to the first circuit substrate; and a plurality of second semiconductor chip packages, wherein each second semiconductor chip package is mounted and electrically coupled to a respective second circuit substrate.

20 Claims, 7 Drawing Sheets

(58) Field of Classification Search
      CPC .......... H05K 1/181–187; H01L 23/498; H01L
                 23/49811; H01L 23/49816; H01L
                 23/49833; H01L 21/565
      USPC .......... 361/767–790; 257/685–690, 737–740
      See application file for complete search history.

(56) References Cited

U.S. PATENT DOCUMENTS

| | | | | |
|---|---|---|---|---|
| 9,281,254 | B2 * | 3/2016 | Yu | H01L 21/6835 |
| 9,583,456 | B2 * | 2/2017 | Uzoh | H01L 24/85 |
| 9,743,519 | B2 * | 8/2017 | Takai | H01L 23/13 |
| 11,791,537 | B2 * | 10/2023 | Ariumi | H05K 1/181 |
| | | | | 361/783 |
| 11,942,405 | B2 * | 3/2024 | Li | H01L 23/647 |
| 2005/0260867 | A1 * | 11/2005 | Ono | H05K 1/144 |
| | | | | 439/65 |
| 2010/0013106 | A1 * | 1/2010 | Otremba | H01L 25/16 |
| | | | | 361/783 |
| 2014/0138816 | A1 * | 5/2014 | Lu | H01L 21/76898 |
| | | | | 257/737 |
| 2018/0247905 | A1 * | 8/2018 | Yu | H01L 21/568 |
| 2020/0105675 | A1 * | 4/2020 | Yu | H01L 23/66 |
| 2021/0384113 | A1 * | 12/2021 | Zhang | H01L 23/49816 |

* cited by examiner

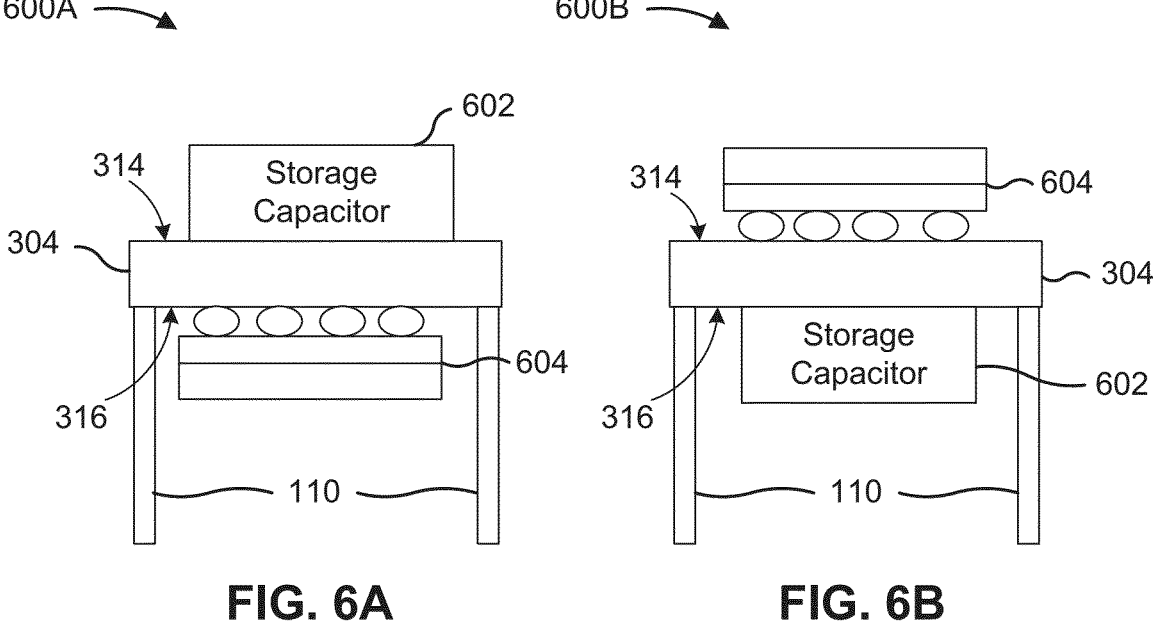
FIG. 6A                    FIG. 6B

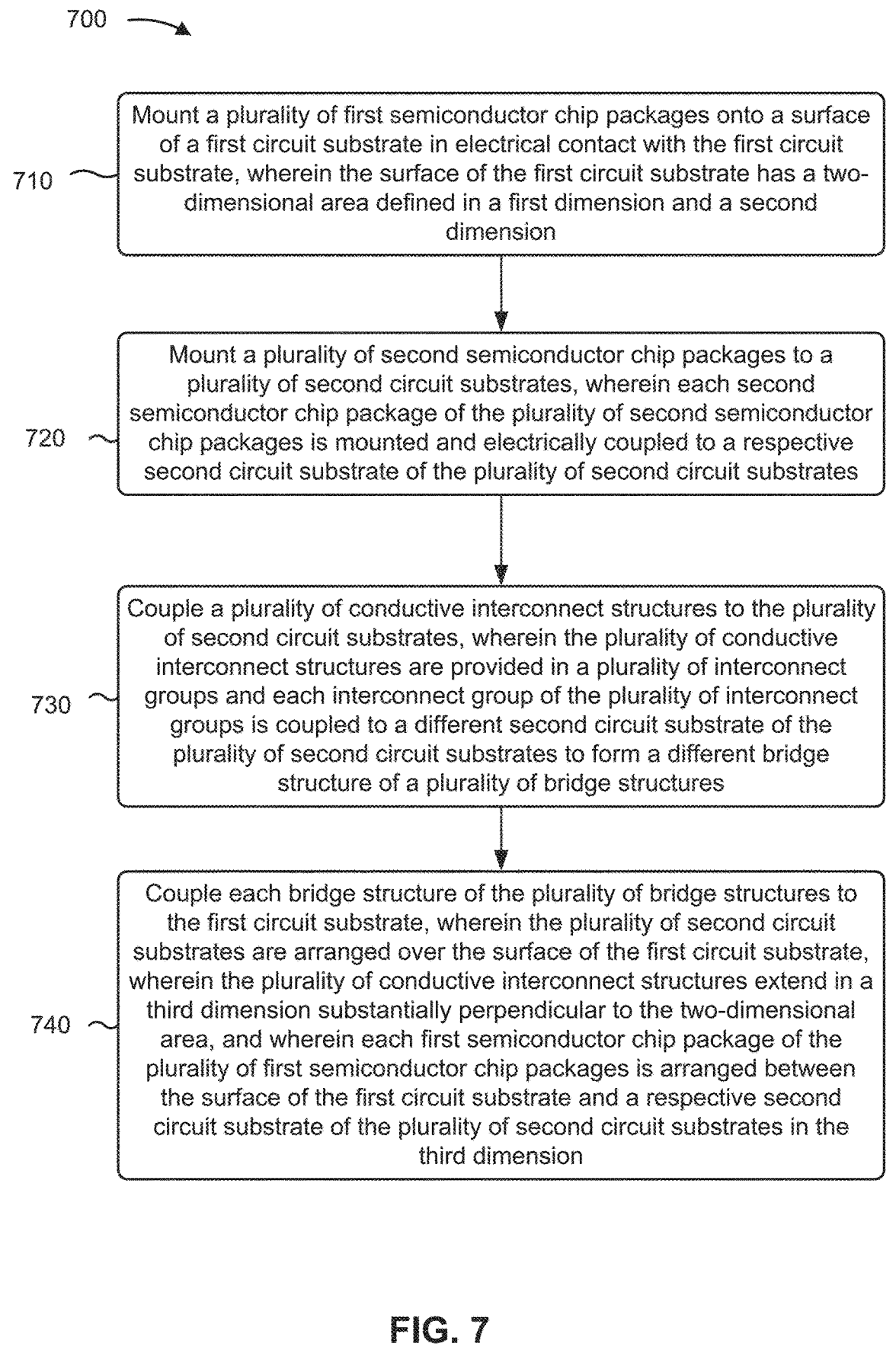

700

710 — Mount a plurality of first semiconductor chip packages onto a surface of a first circuit substrate in electrical contact with the first circuit substrate, wherein the surface of the first circuit substrate has a two-dimensional area defined in a first dimension and a second dimension 720 — Mount a plurality of second semiconductor chip packages to a plurality of second circuit substrates, wherein each second semiconductor chip package of the plurality of second semiconductor chip packages is mounted and electrically coupled to a respective second circuit substrate of the plurality of second circuit substrates 730 — Couple a plurality of conductive interconnect structures to the plurality of second circuit substrates, wherein the plurality of conductive interconnect structures are provided in a plurality of interconnect groups and each interconnect group of the plurality of interconnect groups is coupled to a different second circuit substrate of the plurality of second circuit substrates to form a different bridge structure of a plurality of bridge structures 740 — Couple each bridge structure of the plurality of bridge structures to the first circuit substrate, wherein the plurality of second circuit substrates are arranged over the surface of the first circuit substrate, wherein the plurality of conductive interconnect structures extend in a third dimension substantially perpendicular to the two-dimensional area, and wherein each first semiconductor chip package of the plurality of first semiconductor chip packages is arranged between the surface of the first circuit substrate and a respective second circuit substrate of the plurality of second circuit substrates in the third dimension

FIG. 7

METHODS AND ELECTRONIC SYSTEM ASSEMBLIES FOR A PRINTED CIRCUIT BOARD OVER PRINTED CIRCUIT BOARD ASSEMBLY

CROSS REFERENCE TO RELATED APPLICATION

This patent application claims priority to U.S. Provisional Patent Application No. 63/387,422, filed on Dec. 14, 2022, and entitled "PRINTED CIRCUIT BOARD OVER PRINTED CIRCUIT BOARD ASSEMBLY." The disclosure of the prior application is considered part of and is incorporated by reference into this patent application.

TECHNICAL FIELD

The present disclosure generally relates to semiconductor devices and methods of forming semiconductor devices. For example, the present disclosure relates to a printed circuit board (PCB) over PCB assembly.

BACKGROUND

A semiconductor package includes a semiconductor substrate, one or more semiconductor electronic components coupled to and/or embedded in the semiconductor substrate, and a casing formed over the semiconductor substrate to encapsulate the one or more semiconductor electronic components. The one or more semiconductor electronic components are interconnected by electrical interconnects to form one or more semiconductor devices, such as one or more integrated circuits (ICs) (e.g., one or more dies or chips). For example, the semiconductor electronic components and the electrical interconnects may be fabricated on a semiconductor wafer to form one or more ICs before being diced into dies or chips and then packaged. A semiconductor package may be referred to as a semiconductor chip package that includes one or more ICs. A semiconductor package protects the semiconductor electronic components and the electrical interconnects from damage and includes means for connecting the semiconductor electronic components and the electrical interconnects to external components (e.g., a circuit substrate), such as via balls, pins, leads, contact pads, or other electrical interconnect structures. A semiconductor device assembly may be or may include a semiconductor package or one or more components of a semiconductor package (e.g., one or more semiconductor devices with or without a casing).

An electronic system assembly may include multiple semiconductor packages electrically coupled to a carrier substrate (e.g., circuit substrate). An electronic system assembly may include additional system components electrically coupled to the carrier substrate. The carrier substrate may include electrical interconnects and conductive paths used for interconnecting system components, including the multiple semiconductor packages and other system components of the electronic system assembly. Accordingly, the multiple semiconductor packages may be electrically connected to each other and/or to one or more additional system components via the carrier substrate to form the electronic system assembly. By way of example, other system components may include passive components (e.g., storage capacitors), processing units (e.g., a central processing unit (CPU), a graphics processing unit (GPU), a microprocessor, and/or a microcontroller), control units (e.g., a microcontroller, a memory controller, and/or a power management controller), or one or more other electronic components.

BRIEF DESCRIPTION OF THE DRAWINGS

FIGS. 6A and 6B illustrate example bridge structures according to one or more implementations.

FIG. 7 is a flowchart of an example method of forming an electronic system assembly.

DETAILED DESCRIPTION

Figure 1:
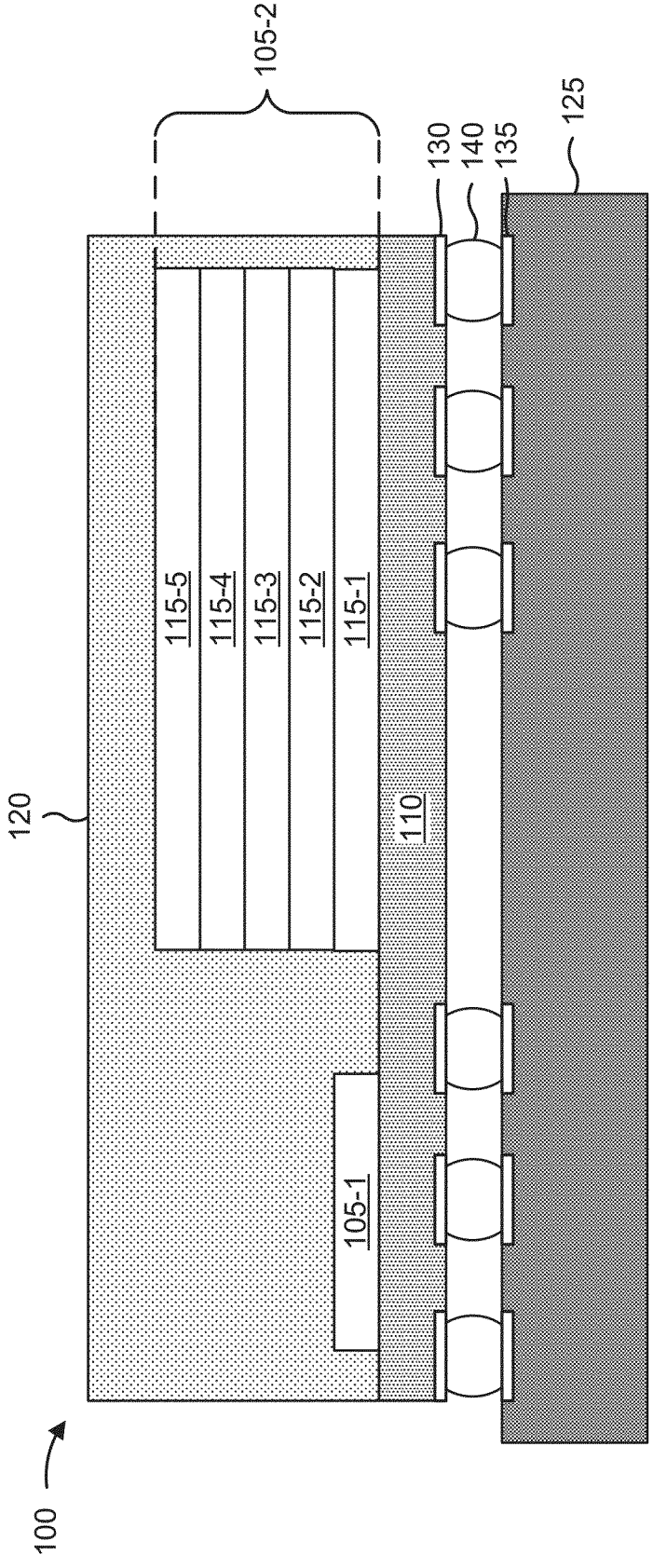
FIG. 1 is a diagram of an example apparatus that may be manufactured using techniques described herein.

Component density on current and future printed circuit board (PCB) assemblies is increasing and causing issues with placement of components on a PCB. For example, current PCB designs for modules and solid state devices (SSDs) are space constrained due to increasing component counts. Compute Express Link™ (CXL™), an open standard for high-speed central processing unit (CPU)-to-device and CPU-to-memory connections, is one example of a module that has insufficient space to fit sufficient memory (e.g., dynamic random access memory (DRAM)) on an area of the PCB.

In addition, as more components are added to a PCB, signal lines on the PCB can become longer (e.g., due to increasing distances between components), more complex (e.g., due to more complex routing designs), and/or more densely arranged (e.g., due to an increase in a number of signal lines per unit of area). As a result, signal integrity of signals transmitted along the signal lines may be more susceptible to electrical disturbances, such as signal crosstalk between neighboring signal lines, higher resistances caused by longer signal lines, and electromagnetic interferences caused by near-by components and neighboring signal lines.

Some implementations disclosed herein are directed to an electronic system assembly that has a main circuit substrate, such as a PCB, and secondary circuit substrates mounted over the main circuit substrate. For example, some implementations are directed to using to using a three-dimensional (3D) space over the main circuit substrate by mounting the secondary circuit substrates over components that are mounted (directly) to the main circuit substrate, allowing higher component density in a two-dimensional footprint and shorter signal paths. For example, conductive interconnect structures that extend in a third dimension substantially perpendicular to a two-dimensional area of the main circuit substrate may be used to both mechanically and electrically couple the secondary circuit substrates to the main circuit substrate. System components, such as a plurality of first semiconductor chip packages, may be mounted to the main circuit substrate, and additional system components, such as a plurality of second semiconductor chip packages and/or storage capacitors, may be mounted to the secondary circuit substrates. Accordingly, the secondary circuit substrates are used to expand an amount of space available for mounting the system components into the third dimension that may otherwise be limited to the two-dimensional area of the main circuit substrate. In some implementations, the two-dimensional footprint of the main circuit substrate may be reduced due to the additional space provided by the secondary circuit substrates.

In addition, the conductive interconnect structures may enable vertical routing of signal lines to shorten the signal paths between the system components, which may improve signal integrity by reducing electrical disturbances. Moreover, in some implementations, varied chipset stacking (e.g., DRAM, NAND memory, and/or power management ICs) may be utilized in the 3D space formed by the secondary circuit substrates to provide additional system capabilities that would be otherwise limited by the two-dimensional area of the main circuit substrate. In some implementations, storage capacitors may be provided in the 3D space formed by the secondary circuit substrates by mounting the storage capacitors to the main circuit substrate and/or to the secondary circuit substrates. In some implementations, stacked module routing and/or connection pins could be used to improve shielding from electromagnetic interference, signal cross-talk, and other electrical disturbances. The secondary circuit substrates may provide an opportunity to position power and ground planes closer to a system component than would otherwise we possible. Furthermore, by increasing separation of the secondary circuit substrates from the main circuit substrate in the third dimension, thermal performance of individual system components and the electronic system assembly as a whole may be improved.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, a power management circuit, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
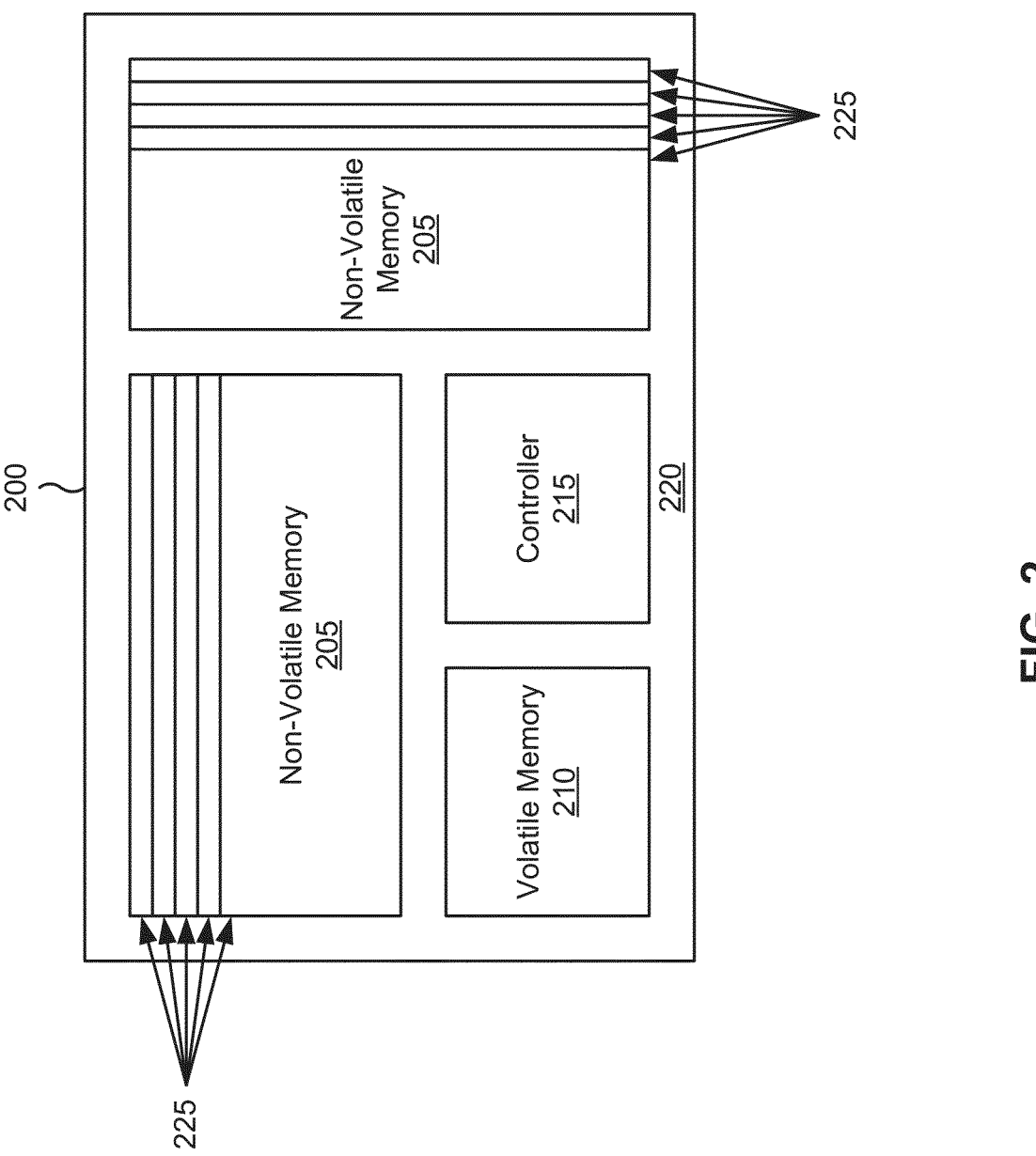
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3A:
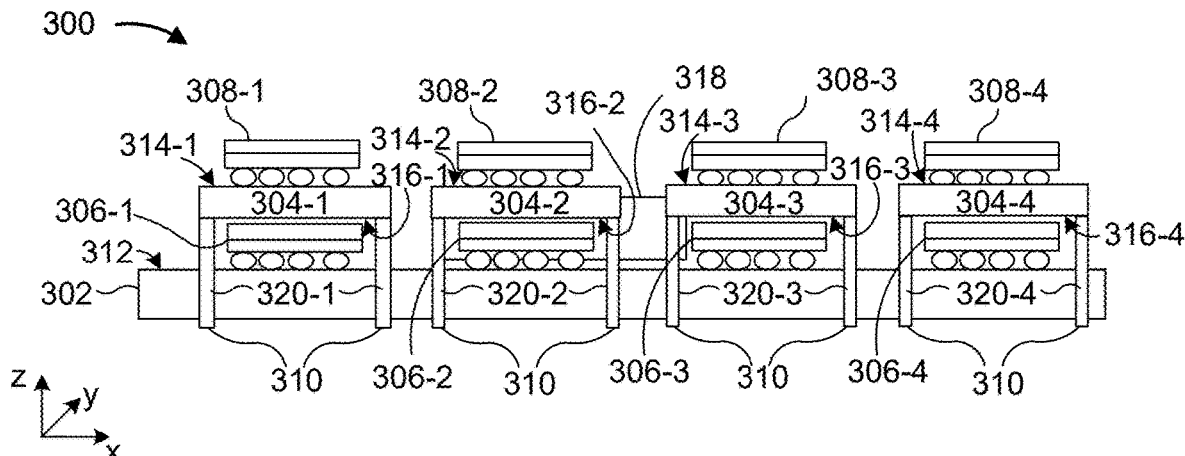
FIG. 3A illustrates a side view of an example electronic system assembly according to one or more implementations.
Figure 3B:
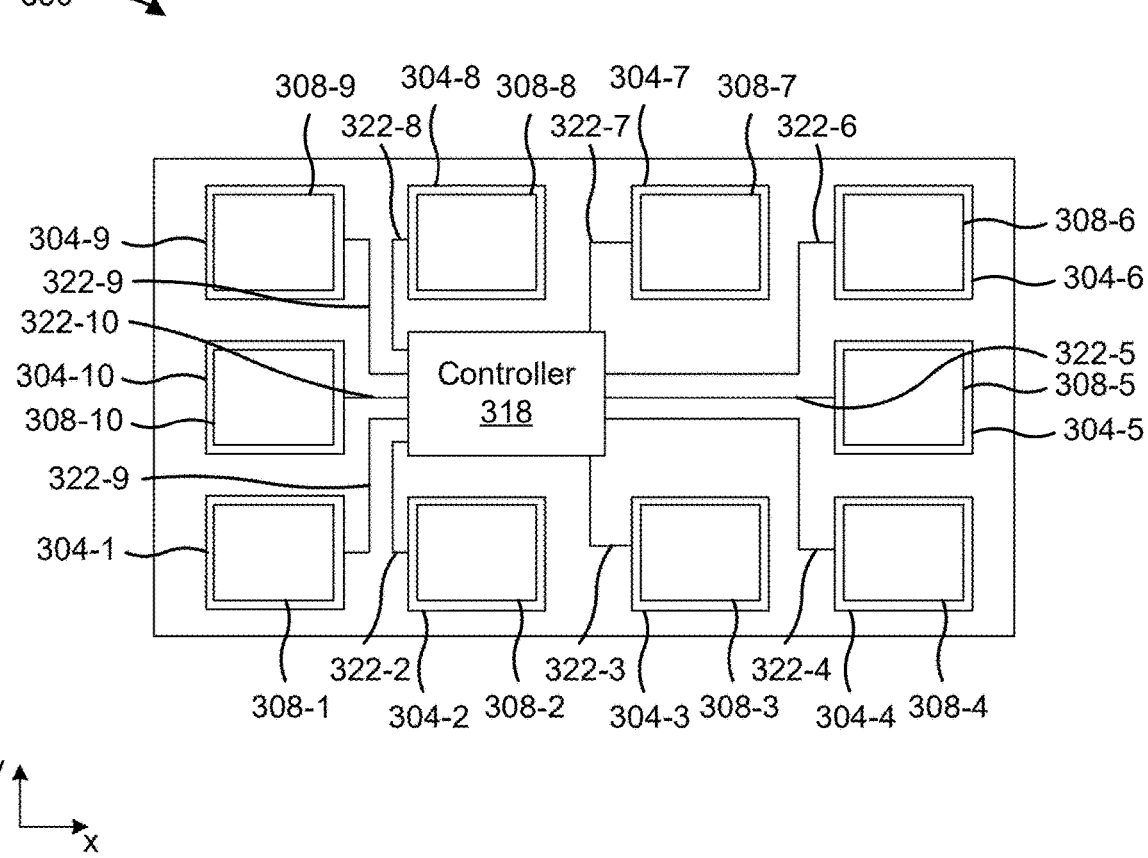
FIG. 3B illustrates a top view of the electronic system assembly shown in FIG. 3A according to one or more implementations.

FIG. 3A illustrates a side view of an example electronic system assembly 300 according to one or more implementations. FIG. 3B illustrates a top view of the electronic system assembly 300 according to one or more implementations. As shown in FIGS. 3A and 3B, the electronic system assembly 300 includes a first circuit substrate 302 (e.g., a main circuit substrate), a plurality of second circuit substrates 304 (e.g., secondary circuit substrates), a plurality of first semiconductor chip packages 306, a plurality of second semiconductor chip packages 308, and a plurality of conductive interconnect structures 310.

The first circuit substrate 302 may be a multilayer circuit substrate, such as a PCB, or other carrier substrate. In some implementations, the first circuit substrate 302 may be a motherboard or another type of system board to which system components of the electronic system assembly 300 are mounted. In particular, the first circuit substrate 302 has a main surface 312 (e.g., an upper surface) on which the system components of the electronic system assembly 300 are mounted and/or electrically coupled thereto. The main surface 312 has a two-dimensional (2D) area defined in a first dimension (e.g., an x-dimension along an x-axis) and a second dimension (e.g., a y-dimension along a y-axis). The main surface 312 may define a first mounting plane on which a first plurality of system components are mounted. In this example, the first mounting plane is an x-y plane defined by the x-axis and the y-axis.

The plurality of second circuit substrates 304, shown as second circuit substrates 304-1 through 304-10, are positioned over the main surface 312, spatially separated from the main surface 312 in a third dimension (e.g., a z-dimension along a z-axis). In other words, the plurality of second circuit substrates 304 are offset from the main surface 312 in the third dimension to define a three-dimensional area between the main surface 312 and the plurality of second circuit substrates 304.

The plurality of second circuit substrates 304 may be multilayer circuit substrates, such as a PCBs, or other carrier substrates. In some implementations, the plurality of second circuit substrates 304 may be daughterboards or another type of expansion board to which additional system components of the electronic system assembly 300 are mounted for extending the circuitry of the first circuit substrate 302. The plurality of second circuit substrates 304 may define additional mounting planes, substantially parallel to the first mounting plane, on which additional pluralities of system components are mounted. Accordingly, the plurality of second circuit substrates 304 expand the electronic system assembly 300 into the third dimension and enable a vertical space above the main surface 312 to be used for additional system components of the electronic system assembly 300. In particular, the plurality of second circuit substrates 304 provide additional surface area for mounting the additional system components of the electronic system assembly 300. As a result, higher component density may be achieved within a two-dimensional footprint of the main surface 312. In addition, the plurality of second circuit substrates 304 may allow the additional system components to be positioned closer to other system components mounted to the main surface 312, thereby enabling shorter signal paths between the system components and improving signal integrity.

The plurality of second circuit substrates 304 include top surfaces 314 (e.g., shown as top surfaces 314-1 through 314-4 in FIG. 3A) and bottom surfaces 316 (e.g., shown as bottom surfaces 316-1 through 316-4 in FIG. 3A). In particular, each second circuit substrate 304 includes a respective top surface of the top surfaces 314 and a respective bottom surface of the bottom surfaces 316 that is arranged opposite to the respective top surface. The top surfaces 314 and the bottom surfaces 316 extend substantially parallel to the main surface 312. In addition, a distance in the third dimension between a bottom surface 316 and the main surface 312 is smaller than a distance in the third dimension between a corresponding top surface 314 (e.g., opposite the bottom surface 316 on the same second circuit substrate 304) and the main surface 312.

In some implementations, the second circuit substrates 304 may have different heights to, for example, accommodate differently-sized system components underneath. Accordingly, in some implementations, the distance in the third dimension between a bottom surface 316 and a corresponding top surface 314 may be different than the distance in the third dimension between another bottom surface 316 and another corresponding top surface 314.

The top surfaces 314 and bottom surfaces 316 provide additional surface area for mounting the additional system components. In some implementations, the additional system components may be mounted to the top surfaces 314 of the plurality of second circuit substrates 304. In some implementations, the additional system components may be mounted to the bottom surfaces 316 of the plurality of second circuit substrates 304. In some implementations, both the top surfaces 314 and bottom surfaces 316 may be utilized for accommodating the additional system components. In other words, the additional system components may be mounted to the top surfaces 314 and the bottom surfaces 316 of the plurality of second circuit substrates 304.

The plurality of first semiconductor chip packages 306 are mounted directly on and electrically coupled to the main surface 312 of the first circuit substrate 302. Each first semiconductor chip package of the plurality of first semiconductor chip packages 306 is positioned vertically between the main surface 312 and a respective second circuit substrate of the plurality of second circuit substrates 304 in the third dimension. In other words, each first semiconductor chip package 306 is arranged in the three-dimensional area defined vertically between the main surface 312 and the plurality of second circuit substrates 304. More particularly, each first semiconductor chip package 306 is arranged between the main surface 312 and one of the plurality of second circuit substrates 304 in the third dimension.

In the example illustrated in FIG. 3A, the plurality of first semiconductor chip packages 306 are shown as first semiconductor chip packages 306-1 through 306-4 arranged under the second circuit substrates 304-1 through 304-4, respectively. However, in practice, the first semiconductor chip packages 306 may include additional semiconductor chip packages that are provided under the second circuit substrates 304-5 through 304-10 that are obscured from view in FIGS. 3A and 3B. In some implementations, multiple system components may be placed under a single second substrate 304.

The plurality of first semiconductor chip packages 306 may be electrically coupled to the main surface 312 by any type of electrical interconnect structure, such as balls, pins, leads, contact pads, surface mount contacts, or other electrical interconnect structures. Thus, the first circuit substrate 302 may be configured to connect to any type of semiconductor package.

In some implementations, the first semiconductor chip packages 306 may include one or more integrated circuits (ICs), including, for example, one or more digital ICs, one or more analog ICs, one or more mixed analog and digital ICs, one or more logic ICs, one or more storage ICs (e.g., memory ICs), one or more power management ICs, or one or more other general purpose ICs or application specific ICs. In some implementations, the first semiconductor chip packages 306 may be memory devices, such as NAND memory devices, NOR memory devices, RAM devices, ROM devices, or DRAM devices. In some implementations, the first semiconductor chip packages 306 includes a combination of different types of memory devices or ICs. For example, some of the first semiconductor chip packages 306 may be one type of memory device or IC and some of the first semiconductor chip packages 306 may be another type of memory device or IC.

The electronic system assembly 300 may include a controller 318 mounted on and electrically coupled to the main surface 312. The first semiconductor chip packages 306 may be electrically coupled to the controller 318 via the first circuit substrate 302 (e.g., via conductive paths). In some implementations, the controller 318 may be a memory controller, and the conductive paths may include memory channels 322 (e.g., memory channels 322-1 through 322-10) used to store data on first semiconductor chip packages 306 or access data stored on first semiconductor chip packages 306 (e.g., to write and read data).

In some implementations, the plurality of second circuit substrates 304 are positioned around the controller 318 in the top view shown in FIG. 3B (e.g., in a plan view). For example, one or more second circuit substrates 304 may be positioned in a first direction from the controller 318 along the first dimension, one or more second circuit substrates 304 may be positioned in a second direction (e.g., opposite the first direction) from the controller 318 along the first dimension, one or more second circuit substrates 304 may be positioned in a third direction from the controller 318 along the second dimension, and one or more second circuit substrates 304 may be positioned in a fourth dimension (e.g., opposite the third direction) from the controller 318 along the second dimension. This enables some or all of the plurality of second circuit substrates 304 to be positioned in relatively close proximity to the controller 318, which enables shorter signal paths between each of the second circuit substrates 304 and the controller 318, thereby improving signal integrity.

The plurality of second semiconductor chip packages 308 are mounted on and electrically coupled to the top surfaces 314 of the plurality of second circuit substrates 304. The plurality of second semiconductor chip packages 308 are shown as second semiconductor chip packages 308-1 through 308-10. Each second semiconductor chip package of the plurality of second semiconductor chip packages 308 may be mounted and electrically coupled to a respective second circuit substrate of the plurality of second circuit substrates 304 in a one-to-one correspondence. In some implementations, multiple system components may be mounted to a single second circuit substrate 304.

The plurality of second semiconductor chip packages 308 may be electrically coupled to the top surfaces 314 by any type of electrical interconnect structure, such as balls, pins, leads, contact pads, surface mount contacts, or other electrical interconnect structures. Thus, the second circuit substrates 304 may be configured to connect to any type of semiconductor package.

In some implementations, the second semiconductor chip packages 308 may include one or more ICs, including, for example, one or more digital ICs, one or more analog ICs, one or more mixed analog and digital ICs, one or more logic ICs, one or more storage ICs (e.g., memory ICs), one or more power management ICs, or one or more other general purpose ICs or application specific ICs. In some implementations, the second semiconductor chip packages 308 may be memory devices, such as NAND memory devices, NOR memory devices, RAM devices, ROM devices, or DRAM devices. In some implementations, the second semiconductor chip packages 308 include a combination of different types of memory devices or ICs. For example, some of the second semiconductor chip packages 308 may be one type of memory device or IC and some of the second semiconductor chip packages 308 may be another type of memory device or IC.

The plurality of conductive interconnect structures 310 extend in the third dimension to connect the plurality of second circuit substrates 304, and, more particularly, the second semiconductor chip packages 308, to the first circuit substrate 302. The plurality of conductive interconnect structures 310 are provided in a plurality of interconnect groups, including interconnect groups 320-1 through 320-4 shown in FIG. 3A. Each interconnect group of the plurality of interconnect groups 320-1 through 320-4 connects a different second circuit substrate of the plurality of second circuit substrates 304 to the first circuit substrate 302. Each interconnect group of the plurality of interconnect groups 320-1 through 320-4 may provide one or more power supply paths, one or more ground supply paths, and one or more signal transmission paths (e.g., data signal transmission paths and/or control signal transmission paths). In the illustrated example of FIGS. 3A and 3B, an interconnect group 320 includes at least two conductive interconnect structures 310 (e.g., positioned on opposite sides of a first semiconductor chip package 306). However, an interconnect group 320 may include a different quantity of conducive interconnect structures 310 (e.g., three or four) in some implementations.

For example, the interconnect group 320-1 includes conductive interconnect structures 310 that connect the second circuit substrate 304-1 to the first circuit substrate 302 and that provide electrical connections (e.g., power supply paths, ground supply paths, and signal transmission paths) to the second semiconductor chip package 308-1. Not only does the interconnect group 320-1 provide electrical connections between the second circuit substrate 304-1 and the first circuit substrate 302, the interconnect group 320-1 also provides mechanical (e.g., structural) support to the second circuit substrate 304-1. Moreover, the interconnect group 320-1 and the second circuit substrate 304-1 form a bridge structure that spans over the first semiconductor chip package 306-1. For example, one or more conductive interconnect structures 310 of the interconnect group 320-1 may be positioned laterally adjacent to or proximate to a first side of the first semiconductor chip package 306-1, and one or more other conductive interconnect structures 310 of the interconnect group 320-1 may be positioned laterally adjacent to or proximate to a second side of the first semiconductor chip package 306-1, the second side being opposite to the first side. In this way, it can be said that the interconnect group 320-1 straddles the first semiconductor chip package 306-1 and that the second circuit substrate 304-1 bridges over (e.g., extends or spans over) the first semiconductor chip package 306-1.

The interconnect groups 320-2, 320-3, and 320-4 provide similar electrical and mechanical connectivity to respective components and are arranged in a similar manner as described above in connection with the interconnect group 320-1.

In some implementations, the conductive interconnect structures 310 may be pins (e.g., gold pins) and the first circuit substrate 302 may include a plurality of through-holes configured to receive the conductive interconnect structures 310. In some implementations, the conductive interconnect structures 310 may be pins (e.g., gold pins) that are surface mounted to the main surface 312 of the first circuit substrate 302. For example, the conductive interconnect structures 310 may be surface mount pins (e.g., surface mount technology pins) with solder tips that are bonded to the main surface 312. Additionally, a conductive interconnect structure 310 may be connected to a corresponding second circuit substrate 304 in a similar manner (e.g., via surface mount or insertion through a through-hole).

The second semiconductor chip packages 308 may be electrically coupled to the controller 318 via the first circuit substrate 302, the second circuit substrates 304, and the conductive interconnect structures 310 (e.g., via conductive paths). In some implementations, the controller 318 may be a memory controller, and the conductive paths connected to the second semiconductor chip packages 308 may include memory channels 322 (e.g., memory channels 322-1 through 322-10) used to store data on second semiconductor chip packages 308 or access data stored on second semiconductor chip packages 308 (e.g., to write and read data).

In some implementations, the conductive interconnect structures 310 may include electrostatic discharge paths from the plurality of second circuit substrates 304 to the first circuit substrate 302. For example, the second circuit substrates 304 may provide connections to power planes and ground planes used in conjunction with one or more decoupling capacitors for electrostatic discharge. As a result, the plurality of second circuit substrates 304 may be used to optimize the power planes and the ground planes closer to system component being protected from electrostatic discharge.

Although semiconductor chip packages 308 are described herein, in some implementations, the electronic system assembly 300 may include storage capacitors instead of one or more of the semiconductor chip packages 308.

In some implementations, stacked module routing and/or connection pins may be used to improve shielding from electromagnetic interference, signal cross-talk, and other electrical disturbances. Furthermore, by increasing separation of the second circuit substrates 304 from the first circuit substrate 302 in the third dimension, thermal performance of individual system components and the electronic system assembly as a whole may be improved. In some implementations, a thermal transfer medium may be provided in the three-dimensional area arranged between the main surface 312 and the plurality of second circuit substrates 304. The thermal transfer medium may be configured to transfer heat generated within the three-dimensional area to a periphery of the three-dimensional area. For example, the thermal transfer medium may be a thermally conductive layer comprising a thermal interface material (TIM).

As indicated above, FIGS. 3A and 3B are provided as examples. Other examples may differ from what is described with regard to FIGS. 3A and 3B. The number and arrangement of components shown in FIGS. 3A and 3B are provided as an example. In practice, there may be additional components, fewer components, different components, or differently arranged components than those shown in FIGS. 3A and 3B.

Figure 4:
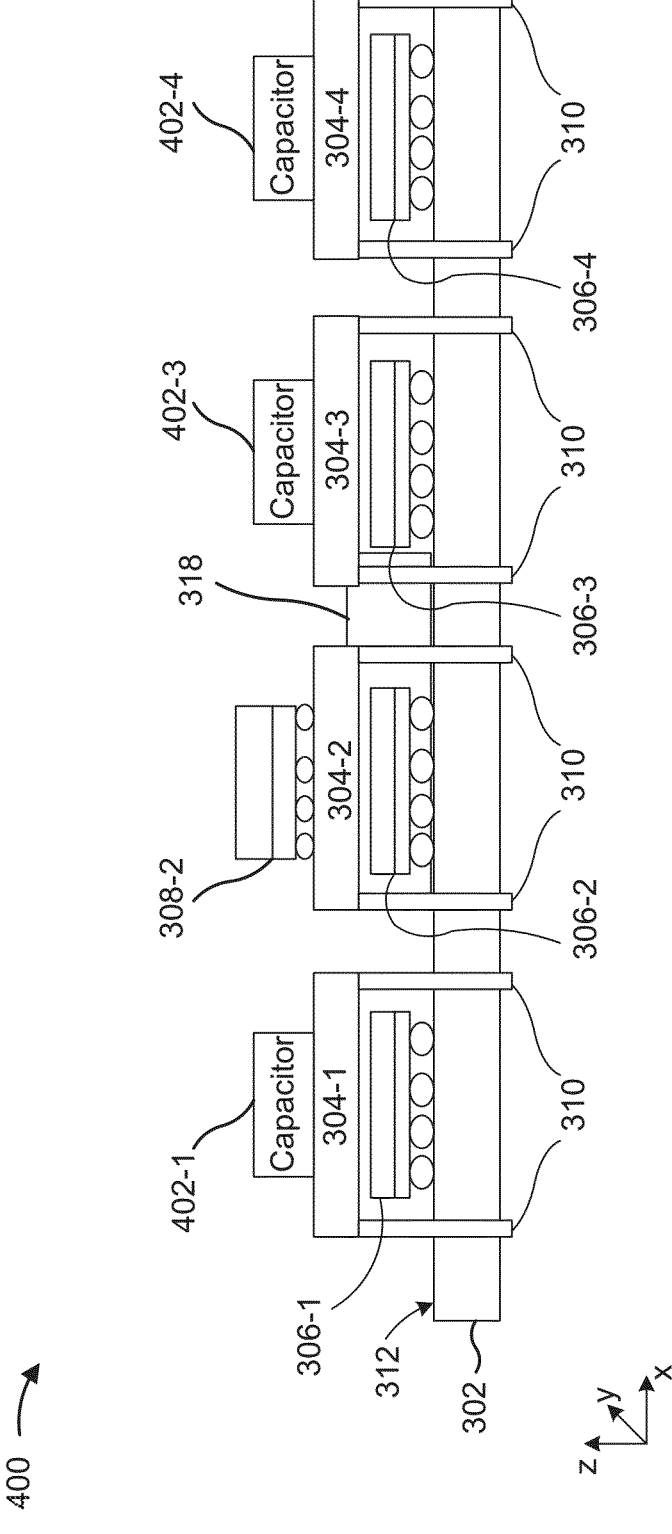
FIG. 4 illustrates a side view of an example electronic system assembly according to one or more implementations.

FIG. 4 illustrates a side view of an example electronic system assembly 400 according to one or more implementations. The electronic system assembly 400 is similar to the electronic system assembly 300 shown in FIG. 3A, with the exception that a plurality of storage capacitors 402, shown as storage capacitors 402-1, 402-3, and 402-4, are mounted to some of the second circuit substrates 304 (e.g., second circuit substrates 304-1, 304-3, and 304-4). A second semiconductor chip package 308-2 is mounted to the second circuit substrate 304-2. In some implementations, the second semiconductor chip package 308-2 may be a power management device (e.g., including a power management IC or a power management controller) configured to perform power source selection, power charging, power discharging, and/or power routing with respect to the storage capacitors 402

For example, the storage capacitors 402 may be electrically coupled to the first semiconductor chip packages 306 for providing backup power thereto. This configuration may be particularly useful when the first semiconductor chip packages 306 are volatile memory devices that require power to maintain stored data. The power management device may be configured to detect a power failure and route stored power from the storage capacitors to the first semiconductor chip packages 306 (e.g., for maintaining stored data). Once normal operation power is restored to the first semiconductor chip packages 306, the power management device may be configured to route power to the storage capacitors 402 for recharging. Accordingly, the second circuit substrates 304 provide additional surface area that can be used to accommodate storage capacitors 402 that form a power bank for system components of the electronic system assembly 300.

Although FIG. 4 shows a power management device mounted on the second circuit substrate 304-2, in some implementations, the power management device may be mounted to the main surface 312 of the first circuit substrate 302, and a storage capacitor may be mounted on the second circuit substrate 304-2.

As indicated above, FIG. 4 is provided as an example. Other examples may differ from what is described with regard to FIG. 4. The number and arrangement of components shown in FIG. 4 are provided as an example. In practice, there may be additional components, fewer components, different components, or differently arranged components than those shown in FIG. 4.

Figure 5A:
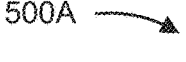
FIG. 5A illustrates a side view of an example electronic system assembly according to one or more implementations.
Figure 5A:
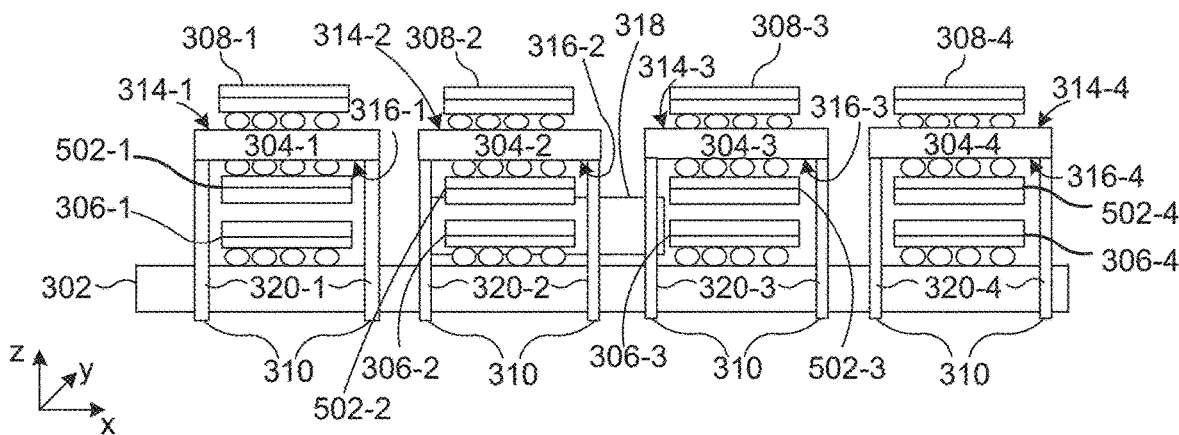

FIG. 5A illustrates a side view of an example electronic system assembly 500A according to one or more implementations. The electronic system assembly 500A is similar to the electronic system assembly 300 shown in FIG. 3A, with the exception that a plurality of third semiconductor chip packages 502 is provided. The third semiconductor chip packages 502, shown as third semiconductor chip packages 502-1 through 502-4, are mounted to the bottom surfaces 316 of the second circuit substrates 304. In particular, each third semiconductor chip package of the plurality of third semiconductor chip packages 502 is mounted and electrically coupled to the bottom surface 316 of a respective second circuit substrate of the plurality of second circuit substrates 304. Thus, the plurality of second circuit substrates 304 support dual-sided mounting, with the second semiconductor chip packages 308 mounted to the top surfaces 314 of the second circuit substrates 304 and the third semiconductor chip packages 502 mounted to the bottom surfaces 316 of the second circuit substrates 304. Accordingly, the component density of the electronic system assembly 500A is increased further within the two-dimensional footprint of the main surface 312.

In this example, each interconnect group 320 of conductive interconnect structures 310 includes additional conductive interconnect structures for electrically connecting the third semiconductor chip packages 502 to the first circuit substrate 302. The additional conductive interconnect structures may provide one or more power supply paths, one or more ground supply paths, and one or more signal transmission paths (e.g., data signal transmission paths and/or control signal transmission paths) to each of the third semiconductor chip packages 502. Alternatively, in some implementations, some of the conductive interconnect structures 310 may be shared between the second semiconductor chip packages 308 and the third semiconductor chip packages 502. For example, power supply paths and ground supply paths, provided by the conductive interconnect structures 310 and routed through the second circuit substrates 304, may be shared between the second semiconductor chip package 308 and the third semiconductor chip packages 502 mounted to a same second circuit substrate 304. In some implementations, some of the second circuit substrates 304 may be single mounted (e.g., top or bottom mounted) and some of the second circuit substrates 304 may be dual mounted (e.g., top and bottom mounted).

In some implementations, the third semiconductor chip packages 502 may include one or more ICs, including, for example, one or more digital ICs, one or more analog ICs, one or more mixed analog and digital ICs, one or more logic ICs, one or more storage ICs (e.g., memory ICs), one or more power management ICs, or one or more other general purpose ICs or application specific ICs. In some implementations, the third semiconductor chip packages 502 may be memory devices, such as NAND memory devices, NOR memory devices, RAM devices, ROM devices, or DRAM devices. In some implementations, the third semiconductor chip packages 502 include a combination of different types of memory devices or ICs. For example, some of the third semiconductor chip packages 502 may be one type of memory device or IC and some of the third semiconductor chip packages 502 may be another type of memory device or IC.

Although the third semiconductor chip packages 502 are described herein, in some implementations, the electronic system assembly 500A may include storage capacitors instead of one or more of the third semiconductor chip packages 502.

As indicated above, FIG. 5A is provided as an example. Other examples may differ from what is described with regard to FIG. 5A. The number and arrangement of components shown in FIG. 5A are provided as an example. In practice, there may be additional components, fewer components, different components, or differently arranged components than those shown in FIG. 5A.

Figure 5B:
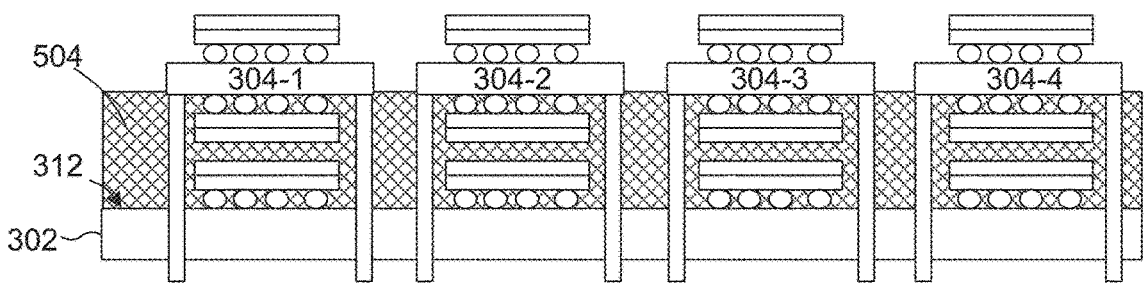
FIG. 5B illustrates a side view of an example electronic system assembly according to one or more implementations.

FIG. 5B illustrates a side view of an example electronic system assembly 500B according to one or more implementations. The electronic system assembly 500B is similar to the electronic system assembly 500A shown in FIG. 5A, with the exception that a thermal transfer medium 504, such as a fluid (e.g., a gas) or a TIM, is provided in the three-dimensional area arranged between the main surface 312 and the plurality of second circuit substrates 304. The thermal transfer medium 504 may be configured to transfer heat generated within the three-dimensional area to a periphery of the three-dimensional area. For example, the heat may be generated by one or more of the first semiconductor chip packages 306 and/or one or more of the third semiconductor chip packages 502. The thermal transfer medium 504 may be configured to transfer the heat away from these system components to prevent overheating and to ensure normal operation parameters are met.

As indicated above, FIG. 5B is provided as an example. Other examples may differ from what is described with regard to FIG. 5B. The number and arrangement of components shown in FIG. 5B are provided as an example. In practice, there may be additional components, fewer components, different components, or differently arranged components than those shown in FIG. 5B.

FIGS. 6A and 6B illustrate example bridge structures 600A and 600B according to one or more implementations. In particular, the bridge structures 600A and 600B are possible variations to the bridge structures described above and shown in connection with FIGS. 3A, 4, 5A, and 5B.

The bridge structure 600A includes a storage capacitor 602 mounted on the top surface 314 of the second circuit substrate 304 and a semiconductor chip package 604 mounted on the bottom surface 316 of the second circuit substrate 304. The storage capacitor 602 may be one of the storage capacitors 402 described above. The semiconductor chip package 604 may be one of the third semiconductor chip packages 502 described above. One or more bridge structures 600A may be coupled to the first circuit substrate 302 via the conductive interconnect structures 310 to expand the system components and capabilities of an electronic system assembly (e.g., electronic system assembly 300, 400, 500A, or 500B).

The bridge structure 600B includes the storage capacitor 602 mounted on the bottom surface 316 of the second circuit substrate 304 and the semiconductor chip package 604 mounted on the top surface 314 of the second circuit substrate 304. The storage capacitor 602 may be one of the storage capacitors 402 described above. The semiconductor chip package 604 may be one of the second semiconductor chip packages 308 described above. One or more bridge structures 600B may be coupled to the first circuit substrate 302 via the conductive interconnect structures 310 to expand the system components and capabilities of an electronic system assembly (e.g., electronic system assembly 300, 400, 500A, or 500B).

As indicated above, FIGS. 6A and 6B are provided as examples. Other examples may differ from what is described with regard to FIGS. 6A and 6B. The number and arrangement of components shown in FIGS. 6A and 6B are provided as an example. In practice, there may be additional components, fewer components, different components, or differently arranged components than those shown in FIGS. 6A and 6B.

FIG. 7 is a flowchart of an example method 700 of forming an electronic system assembly. In some implementations, one or more process blocks of FIG. 7 may be performed by various semiconductor manufacturing equipment.

As shown in FIG. 7, the method 700 may include mounting a plurality of first semiconductor chip packages onto a surface of a first circuit substrate in electrical contact with the first circuit substrate, wherein the surface of the first circuit substrate has a two-dimensional area defined in a first dimension and a second dimension (block 710).

As further shown in FIG. 7, the method 700 may include mounting a plurality of second semiconductor chip packages to a plurality of second circuit substrates, wherein each second semiconductor chip package of the plurality of second semiconductor chip packages is mounted and electrically coupled to a respective second circuit substrate of the plurality of second circuit substrates (block 720).

As further shown in FIG. 7, the method 700 may include coupling a plurality of conductive interconnect structures to the plurality of second circuit substrates, wherein the plurality of conductive interconnect structures are provided in a plurality of interconnect groups and each interconnect group of the plurality of interconnect groups is coupled to a different second circuit substrate of the plurality of second circuit substrates to form a different bridge structure of a plurality of bridge structures (block 730).

As further shown in FIG. 7, the method 700 may include coupling each bridge structure of the plurality of bridge structures to the first circuit substrate, wherein the plurality of second circuit substrates are arranged over the surface of the first circuit substrate, wherein the plurality of conductive interconnect structures extend in a third dimension substantially perpendicular to the two-dimensional area, and wherein each first semiconductor chip package of the plurality of first semiconductor chip packages is arranged between the surface of the first circuit substrate and a respective second circuit substrate of the plurality of second circuit substrates in the third dimension (block 740).

The method 700 may include additional aspects, such as any single aspect or any combination of aspects described below and/or in connection with one or more other methods described elsewhere herein.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the structure of the electronic system assembly (e.g., electronic system assembly 300, 400, 500A, or 500B), an integrated assembly that includes the electronic system assembly (e.g., electronic system assembly 300, 400, 500A, or 500B), any part described herein of the electronic system assembly (e.g., electronic system assembly 300, 400, 500A, or 500B), and/or any part described herein of an integrated assembly that includes the electronic system assembly (e.g., electronic system assembly 300, 400, 500A, or 500B). For example, the method 700 may include forming one or more of the parts 302, 304, 306, 308, 310, 318, 402, 502, 504, 602, 604, and/or 606, and combining one or more of the parts 302, 304, 306, 308, 310, 318, 402, 502, 504, 602, 604, and/or 606 to form the electronic system assembly (e.g., electronic system assembly 300, 400, 500A, or 500B).

The following provides an overview of some Aspects of the present disclosure:

Aspect 1: An electronic system assembly, comprising: a first circuit substrate having a first surface, wherein the first surface has a two-dimensional area defined in a first dimension and a second dimension; a plurality of first semiconductor chip packages mounted on and electrically coupled to the first surface; a plurality of second circuit substrates positioned over the first surface, wherein each first semiconductor chip package of the plurality of first semiconductor chip packages is arranged between the first surface and a respective second circuit substrate of the plurality of second circuit substrates in a third dimension; a plurality of conductive interconnect structures that extend in the third dimension, wherein the plurality of conductive interconnect structures are provided in a plurality of interconnect groups, and wherein each interconnect group of the plurality of interconnect groups connects a different second circuit substrate of the plurality of second circuit substrates to the first circuit substrate; and a plurality of second semiconductor chip packages, wherein each second semiconductor chip package of the plurality of second semiconductor chip packages is mounted and electrically coupled to a respective second circuit substrate of the plurality of second circuit substrates.

Aspect 2: The electronic system assembly of Aspect 1, wherein each interconnect group of the plurality of interconnect groups straddles a respective first semiconductor chip package of the plurality of first semiconductor chip packages.

Aspect 3: The electronic system assembly of any of Aspects 1-2, wherein each interconnect group of the plurality of interconnect groups mechanically supports a different second circuit substrate of the plurality of second circuit substrates to form a corresponding bridge structure that spans over a respective first semiconductor chip package of the plurality of first semiconductor chip packages.

Aspect 4: The electronic system assembly of any of Aspects 1-3, wherein the first plurality of semiconductor chip packages are mounted directly on the first surface by electrical interconnects.

Aspect 5: The electronic system assembly of any of Aspects 1-4, wherein the second plurality of circuit substrates are offset from the first surface in the third dimension to define a three-dimensional area in which the plurality of first semiconductor chip packages are arranged.

Aspect 6: The electronic system assembly of Aspect 5, further comprising: a thermal transfer medium arranged in the three-dimensional area, wherein the thermal transfer medium is configured to transfer heat generated within the three-dimensional area to a periphery of the three-dimensional area.

Aspect 7: The electronic system assembly of Aspect 6, wherein the thermal transfer medium is a thermally conductive layer comprising a thermal interface material.

Aspect 8: The electronic system assembly of any of Aspects 1-7, wherein each second circuit substrate of the plurality of second circuit substrates includes a second surface and a third surface arranged opposite to the second surface, wherein the second surface and the third surface extend substantially parallel to the first surface, and wherein a distance between the third surface and the first surface is smaller than a distance between the second surface and the first surface, and wherein each second semiconductor chip package of the plurality of second semiconductor chip packages is mounted and electrically coupled to the second surface of the respective second circuit substrate of the plurality of second circuit substrates. wherein each second semiconductor chip package of the plurality of second semiconductor chip packages is mounted and electrically coupled to the second surface of the respective second circuit substrate of the plurality of second circuit substrates.

Aspect 9: The electronic system assembly of Aspect 8, further comprising: at least one storage capacitor, wherein each storage capacitor of the at least one storage capacitor mounted and electrically coupled to the third surface of a respective second circuit substrate of the plurality of second circuit substrates.

Aspect 10: The electronic system assembly of any of Aspects 1-9, wherein each second circuit substrate of the plurality of second circuit substrates includes a second surface and a third surface arranged opposite to the second surface, wherein the second surface and the third surface extend substantially parallel to the first surface, and wherein a distance between the third surface and the first surface is smaller than a distance between the second surface and the first surface, and wherein each second semiconductor chip package of the plurality of second semiconductor chip packages is mounted and electrically coupled to the third surface of the respective second circuit substrate of the plurality of second circuit substrates. wherein each second semiconductor chip package of the plurality of second semiconductor chip packages is mounted and electrically coupled to the third surface of the respective second circuit substrate of the plurality of second circuit substrates.

Aspect 11: The electronic system assembly of Aspect 10, further comprising: a plurality of third semiconductor chip packages, wherein each third semiconductor chip package of the plurality of third semiconductor chip packages is mounted and electrically coupled to the second surface of a respective second circuit substrate of the plurality of second circuit substrates.

Aspect 12: The electronic system assembly of Aspect 10, further comprising: at least one storage capacitor, wherein each storage capacitor of the at least one storage capacitor mounted and electrically coupled to the second surface of a respective second circuit substrate of the plurality of second circuit substrates.

Aspect 13: The electronic system assembly of any of Aspects 1-12, further comprising: a controller mounted on the first surface, wherein the controller is electrically coupled to the plurality of first semiconductor chip packages via the first circuit substrate, and wherein the controller is electrically coupled to the plurality of second semiconductor chip packages via the plurality of second circuit substrates, the plurality of conductive interconnect structures, and the first circuit substrate. wherein the controller is electrically coupled to the plurality of first semiconductor chip packages via the first circuit substrate, and wherein the controller is electrically coupled to the plurality of second semiconductor chip packages via the plurality of second circuit substrates, the plurality of conductive interconnect structures, and the first circuit substrate.

Aspect 14: The electronic system assembly of Aspect 13, wherein the plurality of second circuit substrates are positioned around the controller in a plan view.

Aspect 15: The electronic system assembly of any of Aspects 1-14, wherein the first circuit substrate is a motherboard and the plurality of second circuit substrates are daughter circuit boards.

Aspect 16: The electronic system assembly of any of Aspects 1-15, wherein the plurality of first semiconductor chip packages include a first plurality of memory integrated circuits (ICs) and the plurality of second semiconductor chip packages include a second plurality of memory ICs.

Aspect 17: The electronic system assembly of Aspect 16, wherein the first circuit substrate comprises a plurality of memory channels and each second semiconductor chip package of the plurality of second semiconductor chip packages and each interconnect group of the plurality of interconnect groups is coupled to a respective memory channel of the plurality of memory channels.

Aspect 18: The electronic system assembly of Aspect 16, further comprising: a memory controller mounted on the first surface, wherein the memory controller is electrically coupled to the plurality of first semiconductor chip packages via the first circuit substrate, and wherein the memory controller is electrically coupled to the plurality of second semiconductor chip packages via the plurality of second circuit substrates, the plurality of conductive interconnect structures, and the first circuit substrate. wherein the memory controller is electrically coupled to the plurality of first semiconductor chip packages via the first circuit substrate, and wherein the memory controller is electrically coupled to the plurality of second semiconductor chip packages via the plurality of second circuit substrates, the plurality of conductive interconnect structures, and the first circuit substrate.

Aspect 19: The electronic system assembly of any of Aspects 1-18, wherein the plurality of second semiconductor chip packages include at least one power management integrated circuit (IC).

Aspect 20: The electronic system assembly of any of Aspects 1-19, wherein the plurality of conductive interconnect structures include electrostatic discharge paths from the plurality of second circuit substrates to the first circuit substrate.

Aspect 21: An electronic system assembly, comprising: a first circuit substrate having a first surface, wherein the first surface has a two-dimensional area defined in a first dimension and a second dimension; a plurality of semiconductor chip packages mounted on and electrically coupled to the first surface; a plurality of second circuit substrates arranged over the first surface, wherein each semiconductor chip package of the plurality of semiconductor chip packages is arranged between the first surface and a respective second circuit substrate of the plurality of second circuit substrates in a third dimension; a plurality of conductive interconnect structures that extend in the third dimension, wherein the plurality of conductive interconnect structures are provided in a plurality of interconnect groups, and wherein each interconnect group of the plurality of interconnect groups connects a different second circuit substrate of the plurality of second circuit substrates to the first circuit substrate; and a plurality of storage capacitors, wherein each storage capacitor of the plurality of storage capacitors is mounted and electrically coupled to a respective second circuit substrate of the plurality of second circuit substrates.

Aspect 22: The electronic system assembly of Aspect 21, wherein each interconnect group of the plurality of interconnect groups supports a different second circuit substrate of the plurality of second circuit substrates to form a corresponding bridge structure that spans over a respective semiconductor chip package of the plurality of semiconductor chip packages.

Aspect 23: The electronic system assembly of any of Aspects 21-22, further comprising: a controller mounted on the first surface, wherein the controller is configured to distribute power from the plurality of storage capacitors to the plurality of semiconductor chip packages.

Aspect 24: The electronic system assembly of Aspect 23, wherein the plurality of semiconductor chip packages include a plurality of memory integrated circuits (ICs).

Aspect 25: A method of manufacturing an electronic system assembly, the method comprising: mounting a plurality of first semiconductor chip packages onto a surface of a first circuit substrate in electrical contact with the first circuit substrate, wherein the surface of the first circuit substrate has a two-dimensional area defined in a first dimension and a second dimension; mounting a plurality of second semiconductor chip packages to a plurality of second circuit substrates, wherein each second semiconductor chip package of the plurality of second semiconductor chip packages is mounted and electrically coupled to a respective second circuit substrate of the plurality of second circuit substrates; coupling a plurality of conductive interconnect structures to the plurality of second circuit substrates, wherein the plurality of conductive interconnect structures are provided in a plurality of interconnect groups and each interconnect group of the plurality of interconnect groups is coupled to a different second circuit substrate of the plurality of second circuit substrates to form a different bridge structure of a plurality of bridge structures; and coupling each bridge structure of the plurality of bridge structures to the first circuit substrate, wherein the plurality of second circuit substrates are arranged over the surface of the first circuit substrate, wherein the plurality of conductive interconnect structures extend in a third dimension substantially perpendicular to the two-dimensional area, and wherein each first semiconductor chip package of the plurality of first semiconductor chip packages is arranged between the surface of the first circuit substrate and a respective second circuit substrate of the plurality of second circuit substrates in the third dimension.

The foregoing disclosure provides illustration and description but is not intended to be exhaustive or to limit the implementations to the precise forms disclosed. Modifications and variations may be made in light of the above disclosure or may be acquired from practice of the implementations described herein.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An electronic system assembly, comprising:
a first circuit substrate having a first surface, wherein the first surface has a two-dimensional area defined in a first dimension and a second dimension;
a plurality of first semiconductor chip packages mounted on and electrically coupled to the first surface;
a plurality of second circuit substrates positioned over the first surface, wherein each first semiconductor chip package of the plurality of first semiconductor chip packages is arranged between the first surface and a respective second circuit substrate of the plurality of second circuit substrates in a third dimension;
a plurality of conductive interconnect structures that extend in the third dimension,
wherein the plurality of conductive interconnect structures are provided in a plurality of interconnect groups, and
wherein each interconnect group of the plurality of interconnect groups connects a different second circuit substrate of the plurality of second circuit substrates to the first circuit substrate;
a plurality of second semiconductor chip packages, wherein each second semiconductor chip package of the plurality of second semiconductor chip packages is mounted and electrically coupled to a respective second circuit substrate of the plurality of second circuit substrates; and
a controller mounted on the first surface,
wherein the controller is electrically coupled to the plurality of first semiconductor chip packages via the first circuit substrate, and
wherein the controller is electrically coupled to the plurality of second semiconductor chip packages via the plurality of second circuit substrates, the plurality of conductive interconnect structures, and the first circuit substrate.

2. The electronic system assembly of claim 1, wherein each interconnect group of the plurality of interconnect groups straddles a respective first semiconductor chip package of the plurality of first semiconductor chip packages.

3. The electronic system assembly of claim 1, wherein each interconnect group of the plurality of interconnect groups mechanically supports a different second circuit substrate of the plurality of second circuit substrates to form a corresponding bridge structure that spans over a respective first semiconductor chip package of the plurality of first semiconductor chip packages.

4. The electronic system assembly of claim 1, wherein the first plurality of semiconductor chip packages are mounted directly on the first surface by electrical interconnects.

5. The electronic system assembly of claim 1, wherein the second plurality of circuit substrates are offset from the first surface in the third dimension to define a three-dimensional area in which the plurality of first semiconductor chip packages are arranged.

6. The electronic system assembly of claim 1, wherein each second circuit substrate of the plurality of second circuit substrates includes a second surface and a third surface arranged opposite to the second surface, wherein the second surface and the third surface extend substantially parallel to the first surface, and wherein a distance between the third surface and the first surface is smaller than a distance between the second surface and the first surface, and
wherein each second semiconductor chip package of the plurality of second semiconductor chip packages is mounted and electrically coupled to the second surface of the respective second circuit substrate of the plurality of second circuit substrates.

7. The electronic system assembly of claim 1, wherein each second circuit substrate of the plurality of second circuit substrates includes a second surface and a third surface arranged opposite to the second surface, wherein the second surface and the third surface extend substantially parallel to the first surface, and wherein a distance between the third surface and the first surface is smaller than a distance between the second surface and the first surface, and
wherein each second semiconductor chip package of the plurality of second semiconductor chip packages is mounted and electrically coupled to the third surface of the respective second circuit substrate of the plurality of second circuit substrates.

8. The electronic system assembly of claim 1, wherein the plurality of first semiconductor chip packages include a first plurality of memory integrated circuits (ICs) and the plurality of second semiconductor chip packages include a second plurality of memory ICs.

9. The electronic system assembly of claim 1, wherein the plurality of second semiconductor chip packages include at least one power management integrated circuit (IC).

10. The electronic system assembly of claim 5, further comprising: a thermally conductive material arranged in the three-dimensional area, wherein the thermally conductive material is configured to transfer heat generated within the three-dimensional area to a periphery of the three-dimensional area.

11. The electronic system assembly of claim 6, further comprising: at least one storage capacitor, wherein each storage capacitor of the at least one storage capacitor is mounted and electrically coupled to the third surface of a respective second circuit substrate of the plurality of second circuit substrates.

12. The electronic system assembly of claim 7, further comprising: a plurality of third semiconductor chip packages, wherein each third semiconductor chip package of the plurality of third semiconductor chip packages is mounted and electrically coupled to the second surface of a respective second circuit substrate of the plurality of second circuit substrates.

13. The electronic system assembly of claim 7, further comprising: at least one storage capacitor, wherein each storage capacitor of the at least one storage capacitor is mounted and electrically coupled to the second surface of a respective second circuit substrate of the plurality of second circuit substrates.

14. The electronic system assembly of claim 8, wherein the first circuit substrate comprises a plurality of memory channels and each second semiconductor chip package of the plurality of second semiconductor chip packages and each interconnect group of the plurality of interconnect groups is coupled to a respective memory channel of the plurality of memory channels.

15. The electronic system assembly of claim 8, further comprising: a memory controller mounted on the first surface, wherein the memory controller is electrically coupled to the plurality of first semiconductor chip packages via the first circuit substrate, and wherein the memory controller is electrically coupled to the plurality of second semiconductor chip packages via the plurality of second circuit substrates, the plurality of conductive interconnect structures, and the first circuit substrate.

16. An electronic system assembly, comprising:

a first circuit substrate having a first surface, wherein the first surface has a two-dimensional area defined in a first dimension and a second dimension;

a plurality of semiconductor chip packages mounted on and electrically coupled to the first surface;

a plurality of second circuit substrates arranged over the first surface, wherein each semiconductor chip package of the plurality of semiconductor chip packages is arranged between the first surface and a respective second circuit substrate of the plurality of second circuit substrates in a third dimension;

a plurality of conductive interconnect structures that extend in the third dimension, wherein the plurality of conductive interconnect structures are provided in a plurality of interconnect groups, and wherein each interconnect group of the plurality of interconnect groups connects a different second circuit substrate of the plurality of second circuit substrates to the first circuit substrate;

a plurality of storage capacitors, wherein each storage capacitor of the plurality of storage capacitors is mounted and electrically coupled to a respective second circuit substrate of the plurality of second circuit substrates; and a controller mounted on the first surface, wherein the controller is configured to distribute power from the plurality of storage capacitors to the plurality of semiconductor chip packages.

17. The electronic system assembly of claim 16, wherein each interconnect group of the plurality of interconnect groups supports a different second circuit substrate of the plurality of second circuit substrates to form a corresponding bridge structure that spans over a respective semiconductor chip package of the plurality of semiconductor chip packages.

18. A method of manufacturing an electronic system assembly, the method comprising:

mounting a plurality of first semiconductor chip packages onto a surface of a first circuit substrate in electrical contact with the first circuit substrate, wherein the surface of the first circuit substrate has a two-dimensional area defined in a first dimension and a second dimension;

mounting a plurality of second semiconductor chip packages to a plurality of second circuit substrates, wherein each second semiconductor chip package of the plurality of second semiconductor chip packages is mounted and electrically coupled to a respective second circuit substrate of the plurality of second circuit substrates;

coupling a plurality of conductive interconnect structures to the plurality of second circuit substrates, wherein the plurality of conductive interconnect structures are provided in a plurality of interconnect groups and each interconnect group of the plurality of interconnect groups is coupled to a different second circuit substrate of the plurality of second circuit substrates to form a different bridge structure of a plurality of bridge structures;

coupling each bridge structure of the plurality of bridge structures to the first circuit substrate, wherein the plurality of second circuit substrates are arranged over the surface of the first circuit substrate, wherein the plurality of conductive interconnect structures extend in a third dimension substantially perpendicular to the two-dimensional area, and wherein each first semiconductor chip package of the plurality of first semiconductor chip packages is arranged between the surface of the first circuit substrate and a respective second circuit substrate of the plurality of second circuit substrates in the third dimension;

mounting a controller on the surface;

coupling the controller to the plurality of first semiconductor chip packages via the first circuit substrate; and coupling the controller to the plurality of second semiconductor chip packages via the plurality of second circuit substrates, the plurality of conductive interconnect structures, and the first circuit substrate.

19. The method of claim 18, wherein each interconnect group of the plurality of interconnect groups straddles a respective first semiconductor chip package of the plurality of first semiconductor chip packages.

20. The method of claim 18, wherein each interconnect group of the plurality of interconnect groups mechanically supports a different second circuit substrate of the plurality of second circuit substrates to form a corresponding bridge structure that spans over a respective first semiconductor chip package of the plurality of first semiconductor chip packages.

* * * * *